US009755621B1

(12) United States Patent
Sinha et al.

(10) Patent No.: US 9,755,621 B1
(45) Date of Patent: Sep. 5, 2017

(54) SINGLE STAGE CASCODED VOLTAGE LEVEL SHIFTING CIRCUIT

(71) Applicant: STMicroelectronics International N.V., Amsterdam (NL)

(72) Inventors: Rohan Sinha, Ghaziabad (IN); Vikas Rana, Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/162,827

(22) Filed: May 24, 2016

(51) Int. Cl.
*H03L 5/00* (2006.01)
*H03K 3/356* (2006.01)
*H03K 19/0185* (2006.01)

(52) U.S. Cl.
CPC ........... *H03K 3/356113* (2013.01); *H03K 19/018521* (2013.01)

(58) Field of Classification Search
CPC ............ H03K 3/356113; H03K 19/018521
USPC ........................................... 327/333
See application file for complete search history.

(56) References Cited

U.S. PATENT DOCUMENTS

| 4,150,308 | A |   | 4/1979  | Adlhoch           |              |
|-----------|---|---|---------|-------------------|--------------|
| 5,113,097 | A |   | 5/1992  | Lee               |              |
| 5,539,334 | A |   | 7/1996  | Clapp, III et al. |              |
| 5,821,800 | A |   | 10/1998 | Le et al.         |              |
| 5,963,054 | A | * | 10/1999 | Cochran           | H03K 19/00315 |
|           |   |   |         |                   | 326/68       |
| 6,002,290 | A |   | 12/1999 | Avery et al.      |              |
| 6,437,627 | B1| * | 8/2002  | Tran              | H03K 3/356052 |
|           |   |   |         |                   | 327/309      |
| 6,788,125 | B1|   | 9/2004  | Tomsio            |              |
| 7,145,363 | B2|   | 12/2006 | Kim               |              |
| 7,710,183 | B2|   | 5/2010  | Chaba et al.      |              |
| 7,847,590 | B2| * | 12/2010 | Pamperin          | H03K 3/356113 |
|           |   |   |         |                   | 326/68       |

OTHER PUBLICATIONS

Torricelli, Fabrizio, et al: "Half-MOS Single-Poly EEPROM Cell in Standard CMOS Process," IEEE Transactions on Electron Devices, vol. 60, No. 6, Jun. 2013, pp. 1892-1897.
Milani, Luca et al: "Single-Poly-EEPROM Cell in Standard CMOS Process for Medium-Density Applications," IEEE Transactions on Electron Devices, vol. 62, No. 10, Oct. 2015, pp. 3237-3243.
Ishihara, Fujio et al: "Level Conversion for Dual-Supply Systems," IEEE Transactions on Very Large Scale Integration (VLSI) Systems, vol. 12, No. 2, Feb. 2004, pp. 185-195.
Shao, Hui et al: "A Robust, Input Voltage Adaptive and Low Energy Consumption Level Converter for Sub-threshold Logic," IEEE 2007, pp. 312-315.
Yoshikawa, Kuniyoshi et al: "Comparison of Current Flash EEPROM Erasing Methods: Stability and How to Control," IEEE 1992, pp. IEDM 92-595-IEDM 92-598.

(Continued)

*Primary Examiner* — Kenneth B Wells
(74) *Attorney, Agent, or Firm* — Gardere Wynne Sewell LLP

(57) ABSTRACT

A level shifting circuit operates at a high voltage level without stressing the transistors. The circuit has the ability to swing between large supply domains. Multiple output voltage levels are supported for the level shifted signal. Additionally, output nodes are stably driven to supply voltage levels that do not vary with respect to process corner and temperature.

22 Claims, 5 Drawing Sheets

(56) References Cited

OTHER PUBLICATIONS

Na, Kee-Yeol et al: "A Novel Single Polysilicon EEPROM Cell With a Polyfinger Capacitor," IEEE Electron Device Letters, vol. 28, No. 11, Nov. 2007, pp. 1047-1049.
Chen, Tai-Hua et al: "Subthreshold to Above Threshold Level Shifter Design," Journal of Low Power Electronics, vol. 2, 2006, Copyright 2006 American Scientific Publishers, pp. 251-258.
Lanuzza, Marco et al: "Low-Power Level Shifter for Multi-Supply Voltage Designs," IEEE Transactions on Circuits and Systems—II: Express Briefs, vol. 59, No. 12, Dec. 2012, pp. 922-926.
Sanchez, Hector et al: "A Versatile 3.3V/2.5V/1.8V CMOS I/O Driver Built in a 0.2μm 3.5nm Tox 1.8V CMOS Technology," ISSCC99/Session 16/Paper TP 16.2, pp. 276-277, 468.
Moghe, Yashodhan et al: "Nanosecond Delay Floating High Voltage Level Shifters in a 0.35 μm HV-CMOS Technology," IEEE Journal of Solid-State Circuits, vol. 46, No. 2, Feb. 2011, pp. 485-497.
Lombardo, Salvatore Antonino et al: "Dielectric Breakdown Mechanisms in Gate Oxides," Journal of Applied Physics 98, Dec. 2005, 37 pages.
Buchanan, D.A. et al: "On the Relationship Between Stress Induced Leakage Currents and Catastrophic Breakdown in Ultra-Thin $SiO_2$ Based Dielectrics," Elsevier Microelectronic Engineering 36 (1997), pp. 329-332.
Cha, Hyouk-Kyu et al: "A CMOS High-Voltage Transmitter IC for Ultrasound Medical Imaging Applications," IEEE Transactions on Circuits and Systems—II: Express Briefs, vol. 60, No. 6, Jun. 2013, pp. 316-320.

\* cited by examiner

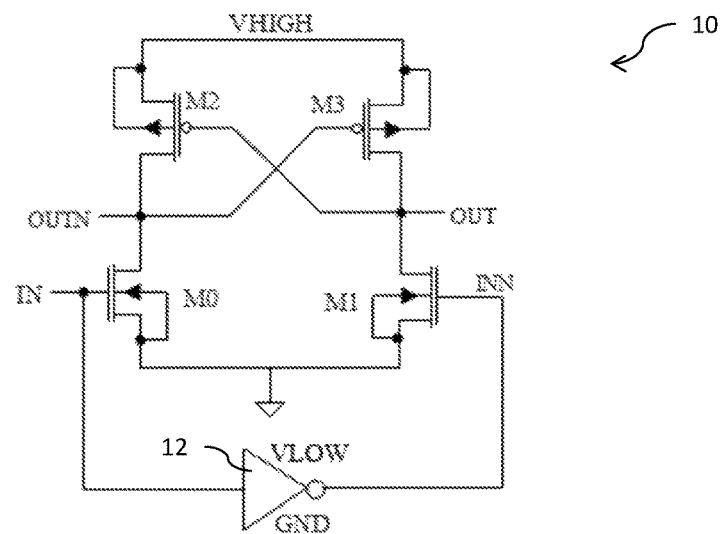
FIG. 1
(Prior Art)
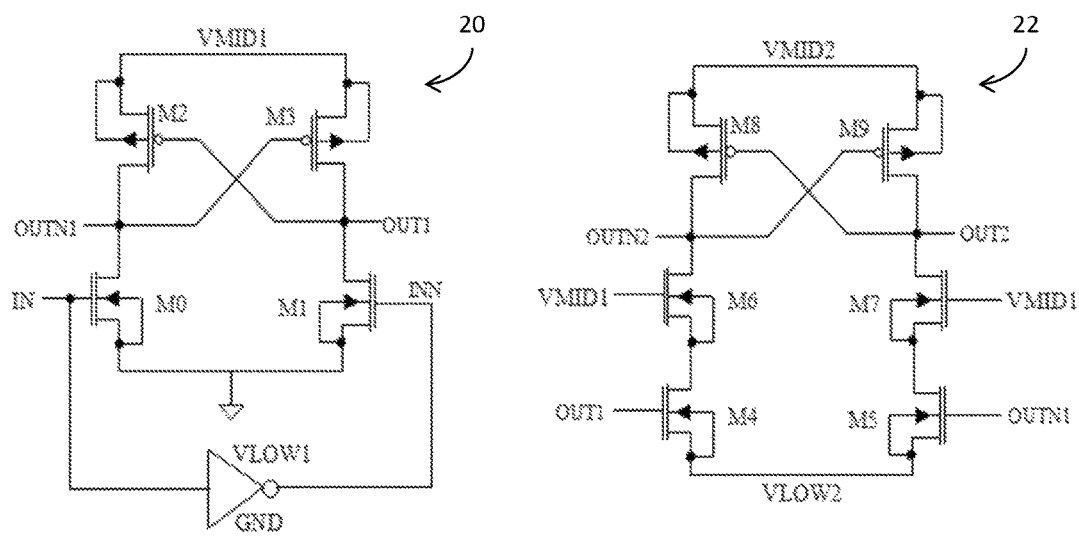
FIG. 2A
(Prior Art)
FIG. 2B
(Prior Art)

SINGLE STAGE CASCODED VOLTAGE LEVEL SHIFTING CIRCUIT

TECHNICAL FIELD

The present invention relates to level shifting circuits and, in particular, to level shifting circuits operable over a wide supply voltage range and with multiple output voltage domains.

BACKGROUND

In very large scale integration (VLSI) technology, the complexity of modern system on chip (SOC) designs is increasing day by day where different parts of the system, some of which are analog in nature and some of which are digital in nature, are integrated on a single chip. In such an SOC design, it is common for different parts of the chip to operate with different supply voltages. For example, a core digital circuit may operate with a first supply voltage at 1.6V while a periphery input/output circuit may operate with a second supply voltage at 2.6V. This is just an example, and it will be understood that many SOC designs could use three or more different supply voltages, and further to that, very high voltages in excess of 10V may be required. So, for effective operation of the SOC design, there is a need to interact between the different parts of the SOC working at different supply voltages. A level shifter is a circuit which converts the logic signals from one voltage level to another voltage level as the logic signals cross between circuits operating with different supply voltages. This requires a level shifting of the logic signals.

Reference is made to FIG. 1 showing a circuit diagram for a conventional level shifting circuit 10 operable to convert logic signals between a first supply voltage (having a high supply node VLOW and a low supply node GND) and a second supply voltage (having a high supply node VHIGH and a low supply node GND). The circuit shown in FIG. 1 represents a conventional positive level shifter. The level shifting circuit 10 comprises four transistors (M0, M1, M2 and M3) and one inverter 12. The inverter 12 functions to generate a complementary input signal INN from the received input signal IN. The inverter is powered from the first supply voltage VLOW. The transistors M0 and M1 are n-channel MOSFET devices with gate (control) terminals coupled to receive the complementary input signals IN and INN. Source (conduction) terminals of the transistors M0 and M1 are coupled to the ground node GND. Drain (conduction) terminals of the transistors M0 and M1 are coupled to output nodes of the level shifter 10 producing the complementary output signals OUTN and OUT. The transistors M2 and M3 are p-channel MOSFET devices having gate (control) terminals cross-coupled in a latching circuit to the output nodes of the level shifter. Drain (conduction) terminals of the transistors M2 and M3 are coupled to the output nodes of the level shifter 10 producing the complementary output signals OUTN and OUT. Source (conduction) terminals of the transistors M0 and M1 are coupled to the high supply voltage VHIGH. With the two different supply voltages VLOW and VHIGH, an input signal IN with a logic high voltage at the VLOW voltage level is converted to an output signal (in this case having a complementary signal form with signals OUT and OUTN) with a logic high voltage at the high supply voltage VHIGH for the signal OUT and a logic low voltage at the high supply voltage VHIGH for the signal OUTN.

The following Table summarizes operation of the circuit 10:

TABLE 1

| Input | Output | |
|---|---|---|
| IN | OUT | OUTN |
| VLOW | VHIGH | 0 v |
| 0 v | 0 v | VHIGH |

A problem with the level shifting circuit 10 of FIG. 1 is that if VHIGH is of a very high voltage level which is more than the safe operating region of transistors used, then all the transistors will be stressed and there will be reliability issues in the circuit. So, to reduce the voltage stress at each transistor it is known in the art to use different circuits or topologies for level shifting.

One example of such a different circuit or topology is shown in FIGS. 2A-2D. Here, four separate level shifting circuits 20, 22, 24 and 26 are coupled in cascade with each other. The overall level shifting circuit is accordingly a four stage level shifter that is configured to provide higher voltage swings (for example, two times more than the safe operating voltage of the transistors or devices). There are different supply voltages for each level shifting stage. Thus, for a four stage circuit there are eight different supply voltages to achieve the desired level shifting functionality.

The first level shifting circuit stage 20 has a circuit configuration like the circuit 10 of FIG. 1. In the first stage, the input signal IN is converted from logic high voltage VLOW1 to a logic high voltage VMID1 for the output signal OUT1. The complementary output signals OUT1 and OUTN1 accordingly vary from 0V (GND) to VMID1 and vice versa depending upon the state of the input signal IN voltage level. These signals OUT1 and OUTN1 are then fed to the next level shifting circuit stage 22 as input signals.

The second level shifting circuit stage 22 comprises six transistors (M4, M5, M6, M7, M8 and M9). The pair of transistors M4 and M5 are n-channel MOSFET devices with gate terminals coupled to receive the complementary input signals which are the complementary output signals OUT1 and OUTN1 from the first stage 20. Source terminals of the transistors M4 and M5 are coupled to a low supply voltage VLOW2. Drain terminals of the transistors M4 and M5 are coupled to source terminals of a pair of transistors M6 and M7 which comprise cascode devices. The gate terminals of cascode transistors M6 and M7 are coupled to receive the high supply voltage VMID1 for the first stage 20. Drain terminals of the transistors M6 and M7 are coupled to output nodes of the level shifter 22 producing the complementary output signals OUTN2 and OUT2. The pair of transistors M8 and M9 are p-channel MOSFET devices having gate terminals cross-coupled in a latching circuit to the output nodes of the level shifter 22. Drain terminals of the transistors M8 and M9 are coupled to the output nodes of the level shifter 22. Source terminals of the transistors M8 and M9 are coupled to the high supply voltage VMID2. The output nodes OUT2 and OUTN2 of the second stage 22 change their state either from VLOW2 to VMID2 level or reciprocally depending upon the logic state of the received input signals which are output from first stage 20.

The VLOW2 voltage level in the second stage 22 is set in such a way that a difference between the VMID2 and VLOW2 voltage does not exceed a safe operation region of the transistors M4-M9.

The third level shifting circuit stage 24 likewise comprises six transistors (M10, M11, M12, M13, M14 and M15) connected in the same circuit configuration as stage 22. However, the stage 24 is coupled to a high supply voltage VMID3 and low supply voltage VLOW3). The inputs to stage 24 are coupled to the outputs of stage 22. Additionally, the gates of the cascode transistors M12 and M13 of the stage 24 are coupled to receive the high supply voltage VMID2 for the second stage 22.

The VLOW3 voltage level in the third stage 24 is set in such a way that a difference between the VMID3 and VLOW3 voltage does not exceed a safe operation region of the transistors M10-M15.

The fourth level shifting circuit stage 26 likewise comprises six transistors (M16, M17, M18, M19, M20 and M21) connected in the same circuit configuration as stages 22 and 24. However, the stage 26 is coupled to a high supply voltage VMID4 and a low supply voltage VLOW4. The inputs to stage 26 are coupled to the outputs of stage 24. Additionally, the gates of the cascode transistors M18 and M19 of the stage 26 are coupled to receive the high supply voltage VMID3 for the third stage 24.

The VLOW4 voltage level in the fourth stage 26 is set in such a way that a difference between the VMID4 and VLOW4 voltage does not exceed a safe operation region of the transistors M16-M21.

The level shifting circuit of FIGS. 2A-2D accordingly functions to level shift the input signal IN from the high supply voltage VLOW1 (referenced to ground) to the high supply voltage VMID1 (also referenced to ground) (using stage 20), then shift to a high supply voltage VMID2 referenced to a low supply voltage VLOW2 (using stage 22), then shift to a high supply voltage VMID3 reference to a low supply voltage VLOW3 (using stage 24), and then shift to a high supply voltage VMID4 reference to a low supply voltage VLOW4 (using stage 26). The following Tables summarize operation of the circuit 20:

TABLE 2

1$^{st}$ stage

| Input | | Output | |
|---|---|---|---|
| IN | INN | OUT1 | OUTN1 |
| VLOW1 | 0 v | VMID1 | 0 v |
| 0 v | VLOW1 | 0 v | VMID1 |

TABLE 3

2$^{nd}$ stage

| Input | | Output | |
|---|---|---|---|
| OUT1 | OUTN1 | OUT2 | OUTN2 |
| VMID1 | 0 v | VMID2 | VLOW2 |
| 0 v | VMID1 | VLOW2 | VMID2 |

TABLE 4

3$^{rd}$ stage

| Input | | Output | |
|---|---|---|---|
| OUT2 | OUTN2 | OUT3 | OUTN3 |
| VMID2 | VLOW2 | VMID3 | VLOW3 |
| VLOW2 | VMID2 | VLOW3 | VMID3 |

TABLE 5

4$^{th}$ stage

| Input | | Output | |
|---|---|---|---|
| OUT3 | OUTN3 | OUT4 | OUTN4 |
| VMID3 | VLOW3 | VMID4 | VLOW4 |
| VLOW3 | VMID3 | VLOW4 | VMID4 |

The transistors M6, M7, M12, M13, M18 and M19 are positioned in cascoded fashion to isolate the NMOS input transistors M4, M5, M10, M11, M16 and M17 from the respective output nodes when the output signal levels goes to its maximum logic high value for the given supply voltage.

A drawback of multi-stage level shifters (such as shown in FIGS. 2A-2D) is that the circuit requires many different supply voltages in order to obtain a swing of twice the maximum operating voltage of the transistors used. Also, these supply voltages should be chosen in such a way that none of the transistors is placed under voltage stress.

For example, if a 4.5V capable transistor is used and it is desired to achieve a VMID4=VHIGH=13.5V, then following voltages should be selected for the various supply voltages:

First stage: input signal logic high voltage 1.8 v and logic low voltage (GND) 0V, with high supply voltage VMID1=4.5V;
Second stage: VMID2=7.5V; VLOW2=3V;
Third stage: VMID3=10.5V; VLOW3=6V; and
Fourth stage: VMID4=13.5V; VLOW4=9V.
The difference between $$|VMID(n) - VLOW(n+1)|_{min} = 1.5V, \text{ where } n >= 1$$

in order to allow proper operation of the level shifter stages.

An additional drawback of multi-stage level shifters is the requirement of many supply voltages (high and low) for the stages, and it is known in the art that provision of the supply voltage circuitry for such supply voltages may not be easily available and if available this comes with a larger cost in terms of both area and power. So, the need for the many supply voltages in multi-stage level shifters puts a constraint on practical use of this type of level shifting circuit. Still further, the foregoing problems are magnified if the system requires even higher levels for the voltage swings.

A still further drawback is that the generated output signals do not include logic signals which vary between, for example, "VMID2 to 0 v", "VLOW4 to 0 v" or "VLOW4 to VMID1". That is from "7.5 v to 0 v", "9 v to 0 v" or "9 v to 4.5 v". So, if there is a situation where such a signal varying between these supply levels is needed, then the multi-stage level shifting circuit is not usable.

Additionally, there is a further concern with switching speed. Multi-stage level shifting circuits will exhibit a slower switching speed than other types of level shifters, especially those which operate using only a single stage. Thus, it would be preferable to use a single stage. FIG. 3 shows an example of a single stage level shifting circuit 60 operable to convert a logic signal having a high supply voltage VLOW referenced to ground GND to a plurality of different output supply voltages.

The circuit 60 shown in FIG. 3 is known as a single stage cascoded voltage level shifter. This circuit uses four supply voltages referred to as VLOW, VMIDL, VMIDH and VHIGH referenced to a ground voltage GND. The input signal IN has a logic high voltage level at the VLOW supply voltage level. The supply voltages VMIDL and VMIDH are used as cascode voltages for biasing the gate terminals of cascode transistors in the circuit 60. The supply voltage VHIGH is the level shifted output voltage, and thus the output signal OUTH has a logic high voltage level at the VHIGH supply voltage level. The circuit 60 supports a maximum voltage swing that is three-times the maximum operating voltage of the transistors and it is fully cascoded by the VMIDL and VMIDH voltages to avoid voltage stress in the devices. This circuit 60 further addresses most of the problems associated with the multi-stage level shifter circuits.

The level shifting circuit 60 comprises twelve transistors (M0-M11) and one inverter 62. The inverter 62 functions to generate a complementary input signal INN from the received input signal IN. The inverter is powered from the high supply voltage VLOW referenced to ground GND. The pair of input transistors M0 and M1 are n-channel MOSFET devices with gate (control) terminals coupled to respectively receive the complementary input signals IN and INN. Source (conduction) terminals of the transistors M0 and M1 are coupled to the ground node GND. Drain (conduction) terminals of the transistors M0 and M1 are coupled, respectively, to a pair of intermediate nodes NET2 and NET1. The intermediate nodes NET2 and NET1 of the circuit 60 change their state either from ground to VMIDL−|Vtn| or reciprocally depending upon the logic state of the received input signal IN (where Vtn is the threshold voltage of the NMOS transistors M2 and M3).

The pair of transistors M2 and M3 are coupled, respectively, in series with transistors M0 and M1 at the intermediate nodes NET2 and NET1 with the source terminals of transistors M2 and M3 coupled, respectively, to the drain terminals of transistors M0 and M1. The gate terminals of cascode transistors M2 and M3 are coupled to receive the low cascode supply voltage VMIDL. Drain terminals of the transistors M2 and M3 are coupled, respectively, to a complementary pair of output nodes OUTNL and OUTL. The transistors M2 and M3 are n-channel MOSFET devices. The output nodes OUTNL and OUTL of the circuit 60 change their state either from ground to MIDH−|Vtn| or reciprocally depending upon the logic state of the received input signal IN (where Vtn is the threshold voltage of the NMOS transistors M6 and M7).

The pair of transistors M4 and M5 are coupled, respectively, in series with transistors M2 and M3 at the output nodes OUTNL and OUTL with the drain terminals of transistors M4 and M5 coupled, respectively, to the drain terminals of transistors M2 and M3. The gate terminals of cascode transistors M4 and M5 are coupled to receive the low cascode supply voltage VMIDL. Source terminals of the transistors M4 and M5 are coupled, respectively, to the pair of intermediate nodes NET3 and NET4. The transistors M4 and M5 are p-channel MOSFET devices. The intermediate nodes NET3 and NET4 of the circuit 60 change their state either from VMIDL+|Vtp| to VMIDH−|Vtn| level or reciprocally depending upon the logic state of the received input signal IN (where Vtp is the threshold voltage of the PMOS transistors M4 and M5 and Vtn is the threshold voltage of the NMOS transistors M6 and M7).

The pair of transistors M6 and M7 are coupled, respectively, in series with transistors M4 and M5 at the intermediate nodes NET3 and NET4 with the source terminals of transistors M6 and M7 coupled, respectively, to the source terminals of transistors M4 and M5. The gate terminals of cascode transistors M6 and M7 are coupled to receive the high cascode supply voltage VMIDH. Drain terminals of the transistors M6 and M7 are coupled, respectively, to the pair of complementary output nodes OUTNM and OUTM. The transistors M6 and M7 are n-channel MOSFET devices. The output nodes OUTNM and OUTM of the circuit 60 change their state either from VMIDL+|Vtp| to VHIGH level or reciprocally depending upon the logic state of the received input signal IN (where Vtp is the threshold voltage of the PMOS transistors M4 and M5).

The pair of transistors M8 and M9 are coupled, respectively, in series with transistors M6 and M7 at the output nodes OUTNM and OUTM with the drain terminals of transistors M8 and M9 coupled, respectively, to the drain terminals of transistors M6 and M7. The gate terminals of cascode transistors M8 and M9 are coupled to receive the high cascode supply voltage VMIDH. Source terminals of the transistors M8 and M9 are coupled, respectively, to the pair of complementary output nodes OUTNH and OUTH. The transistors M8 and M9 are p-channel MOSFET devices.

The pair of transistors M10 and M11 are p-channel MOSFET devices having gate terminals cross-coupled in a latching circuit to the output nodes OUTNH and OUTH. Drain terminals of the transistors M10 and M11 are coupled, respectively, to the output nodes OUTNH and OUTH. Source terminals of the transistors M10 and M11 are coupled to the high supply voltage VHIGH. The output nodes OUTNH and OUTH of the circuit 60 change their state either from VMIDH+|Vtp| to VHIGH level or reciprocally depending upon the logic state of the received input signal IN (where Vtp is the threshold voltage of the PMOS transistors M8 and M9).

The following Tables summarize operation of the circuit 60:

TABLE 6

| Input | | Output | | | | |
|---|---|---|---|---|---|---|
| IN | INN | OUTH | OUTM | NET4 | OUTL | NET1 |
| VLOW | 0v | VHIGH | VHIGH | VMIDH−|Vtn| | VMIDH−|Vtn| | VMIDL−|Vtn| |
| 0v | VLOW | VMIDH+|Vtp| | VMIDL+|Vtp| | VMIDL +|Vtp| | 0 | 0 |

TABLE 7

| Input | | Output | | | | |
| --- | --- | --- | --- | --- | --- | --- |
| IN | INN | OUTNH | OUTNM | NET3 | OUTNL | NET2 |
| VLOW | 0v | VMIDH+\|Vtp\| | VMIDL+\|Vtp\| | VMIDL+\|Vtp\| | 0 | 0 |
| 0v | VLOW | VHIGH | VHIGH | VMIDH−\|Vtn\| | VMIDH−\|Vtn\| | VMIDL−\|Vtn\| |

As noted above, the voltages at a number of nodes settle either to a voltage of VMID+|Vtp| or VMID−|Vtn|, where |Vtp| is the threshold voltage of the PMOS transistors and |Vtn| is the threshold of the NMOS transistors. These threshold voltages are known to vary according to the different process corners and temperature. So, the output voltage levels which are driven at these nodes are not stable and are poorly driven.

Moreover, if in case the voltage at one of the output nodes changes due to coupling or charge loss, for example when IN is at 0V the minimum voltage at OUTH node is VMIDH+ |Vtp|, and if by any means it goes below that voltage then there is no circuitry to pull that node to its desired state leading to improper functionality.

A further problem with the level shifting circuit 60 is that the switching speed of the circuit slows when driving a load from nodes OUTH and OUTHN. This is because the minimum voltage at OUTH and OUTHN nodes (i.e., VMIDH+ |Vtp|) is not very well driven. So, when a capacitive load is driven, charging and discharging of capacitive load takes a longer time.

There is accordingly a need in the art for an improved level shifting circuit that addresses the drawbacks of prior art circuit such as those shown in FIGS. 1, 2A-2D and 3.

SUMMARY

In an embodiment, a level shifting circuit comprises: a pair of input transistors of a first type coupled respectively between a first pair of complementary output nodes and a reference supply node; a first pair of cascode transistors of the first type coupled between a second pair of complementary output nodes and the first pair of complementary output nodes, respectively, wherein control terminals of the first pair of cascode transistors are coupled to receive a first cascode supply voltage; a second pair of cascode transistors of a second type coupled between a third pair of complementary output nodes and the second pair of complementary output nodes, respectively, wherein control terminals of the second pair of cascode transistors are coupled to receive the first cascode supply voltage; a first drive transistor having a source-drain path coupled between one output node of the third pair of complementary output nodes and the control terminal of one transistor of the second pair of cascode transistors, a control terminal of the first drive transistor coupled to one output node of the second pair of complementary output nodes; and a second drive transistor having a source-drain path coupled between another output node of the third pair of complementary output nodes and the control terminal of another transistor of the second pair of cascode transistors, a control terminal of the second drive transistor coupled to another output node of the second pair of complementary output nodes.

In an embodiment, a level shifting circuit comprises: an input transistor of a first type having a first conduction terminal coupled to a first output node, a second conduction terminal coupled to a reference supply node and a control terminal coupled to receive an input signal; a first cascode transistor of the first type having a first conduction terminal coupled to a second output node, a second conduction terminal coupled to the first output node and a control terminal coupled to receive a first cascode supply voltage; a second cascode transistor of a second type having a first conduction terminal coupled to a third output node, a second conduction terminal coupled to the second output node and a control terminal coupled to receive the first cascode supply voltage; and a first drive transistor of the second type having a first conduction terminal coupled to the third output node, a second conduction terminal coupled to the control terminal of the second cascode transistor and a control terminal coupled to the second output node.

In an embodiment, a level shifting circuit comprises: an input transistor of a first type having a first conduction terminal coupled to a first node, a second conduction terminal coupled to a reference supply node and a control terminal coupled to receive an input signal; a first cascode transistor of the first type having a first conduction terminal coupled to a second node, a second conduction terminal coupled to the first node and a control terminal coupled to receive a first cascode supply voltage; a second cascode transistor of a second type having a first conduction terminal coupled to a first output node, a second conduction terminal coupled to the second node and a control terminal coupled to receive the first cascode supply voltage; a first drive transistor of the second type having a first conduction terminal coupled to the first output node, a second conduction terminal coupled to the control terminal of the second cascode transistor and a control terminal coupled to the second node; and a first cross coupled latching circuit coupled between a supply voltage and the first output node.

BRIEF DESCRIPTION OF THE DRAWINGS

For a better understanding of the embodiments, reference will now be made by way of example only to the accompanying figures in which:

FIG. 1 is a circuit diagram for a conventional level shifting circuit;

FIGS. 2A-2D show a circuit diagram for a conventional level shifting circuit;

DETAILED DESCRIPTION OF THE DRAWINGS

Figure 2C:
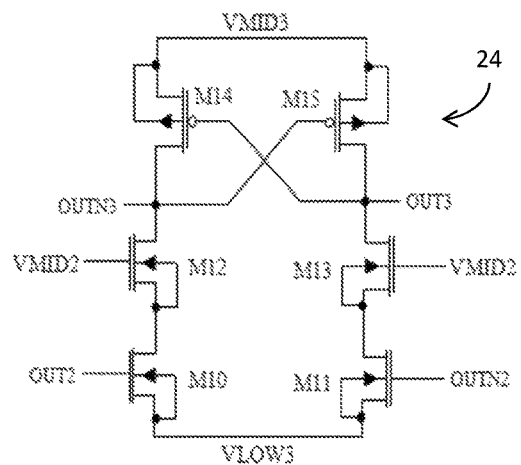
Figure 2D:
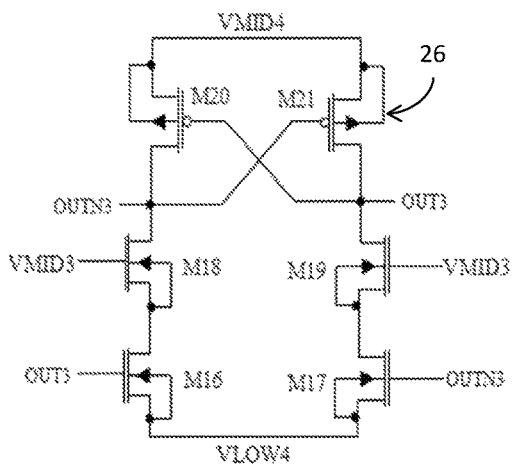
Figure 3:
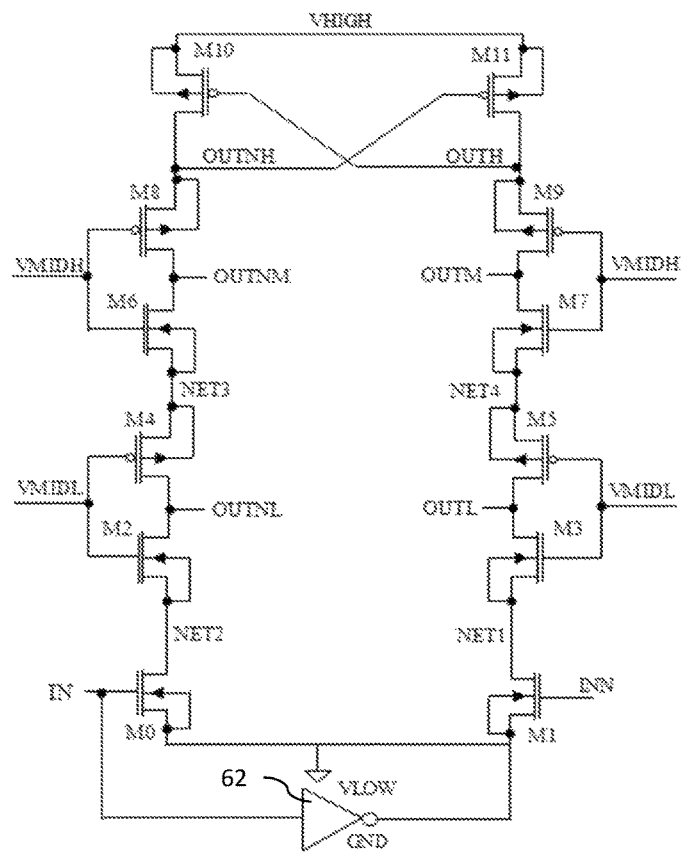
FIG. 3 is a circuit diagram for a conventional level shifting circuit.
Figure 4:
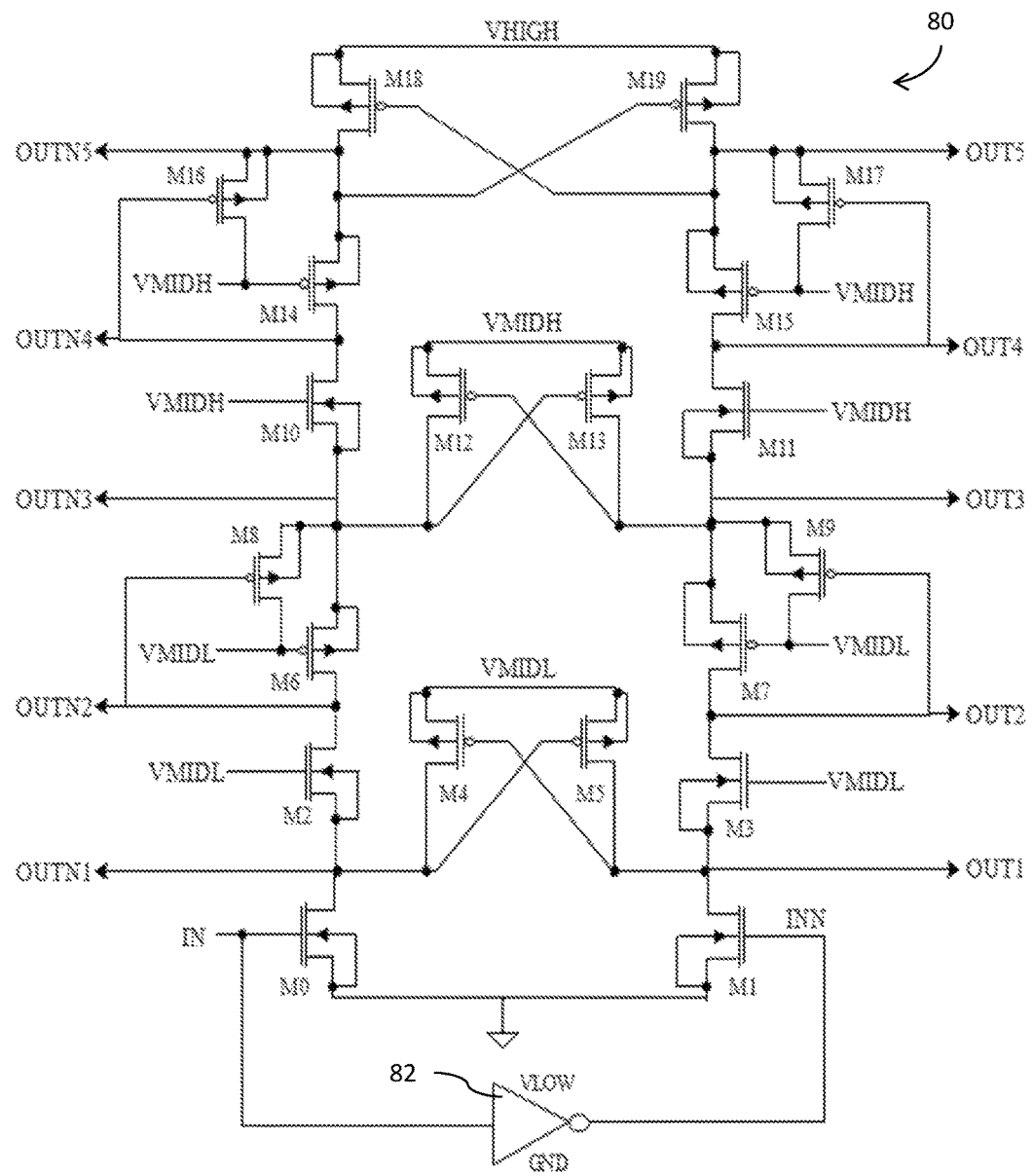
FIG. 4 is a circuit diagram for a level shifting circuit.

Reference is now made to FIG. 4 showing a circuit diagram for a level shifting circuit 80. The circuit 80 shown in FIG. 4 is a single stage cascoded voltage level shifter. This circuit uses four supply voltages referred to as VLOW, VMIDL, VMIDH and VHIGH referenced to a ground voltage GND. The input signal IN has a logic high voltage level at the VLOW supply voltage level. The supply voltages VMIDL and VMIDH are used as cascode voltages for biasing the gate terminals of cascode transistors in the circuit 80 and are further used as supply voltages for cross-coupled transistor circuits at certain level shifted output nodes. The supply voltage VHIGH is the level shifted output voltage, and thus the output signal at nodes OUT5/OUTN5 has a logic high voltage level at the VHIGH supply voltage level. The circuit 80 supports a maximum voltage swing that is two-times the maximum operating voltage of the transistors and it is fully cascoded by the VMIDL and VMIDH voltages to avoid voltage stress in the devices. This circuit 80 further addresses the problems associated with the level shifter circuit of FIG. 3.

The level shifting circuit 80 comprises twenty transistors (M0-M19) and one inverter 82. The inverter 82 functions to generate a complementary input signal INN from the received input signal IN. The inverter is powered from the supply voltage VLOW referenced to ground GND. The pair of input transistors M0 and M1 are n-channel MOSFET devices with gate (control) terminals coupled to respectively receive the complementary input signals IN and INN. Source (conduction) terminals of the transistors M0 and M1 are coupled to the ground node GND. Drain (conduction) terminals of the transistors M0 and M1 are coupled, respectively, to a first pair of complementary output nodes OUTN1 and OUT1. The transistors M4 and M5 are p-channel MOSFET devices having gate terminals cross-coupled in a latching circuit to the complementary output nodes OUTN1 and OUT1. Drain terminals of the transistors M4 and M5 are coupled, respectively, to the complementary output nodes OUTN1 and OUT1. Source terminals of the transistors M4 and M5 are coupled to the cascode supply voltage VMIDL. The complementary output nodes OUTN1 and OUT1 of the circuit 80 change their state either from ground to VMIDL or reciprocally depending upon the logic state of the received input signal IN.

The pair of transistors M2 and M3 are coupled, respectively, in series with transistors M0 and M1 at the first pair of complementary output nodes OUTN1 and OUT1 with the source terminals of transistors M2 and M3 coupled, respectively, to the drain terminals of transistors M0 and M1. The gate terminals of cascode transistors M2 and M3 are coupled to receive the low cascode supply voltage VMIDL. Drain terminals of the transistors M2 and M3 are coupled, respectively, to a second pair of complementary output nodes OUTN2 and OUT2. The transistors M2 and M3 are n-channel MOSFET devices. The complementary output nodes OUTN2 and OUT2 of the circuit 80 change their state either from ground to VMIDH or reciprocally depending upon the logic state of the received input signal IN.

The pair of transistors M6 and M7 are coupled, respectively, in series with transistors M2 and M3 at the complementary output nodes OUTN2 and OUT2 with the drain terminals of transistors M6 and M7 coupled, respectively, to the drain terminals of transistors M2 and M3. The gate terminals of cascode transistors M6 and M7 are coupled to receive the low cascode supply voltage VMIDL. Source terminals of the transistors M6 and M7 are coupled, respectively, to a third pair of complementary output nodes OUTN3 and OUT3. The transistors M6 and M7 are p-channel MOSFET devices. The transistors M12 and M13 are p-channel MOSFET devices having gate terminals cross-coupled in a latching circuit to the complementary output nodes OUTN3 and OUT3. Drain terminals of the transistors M12 and M13 are coupled, respectively, to the complementary output nodes OUTN3 and OUT3. Source terminals of the transistors M12 and M13 are coupled to the cascode supply voltage VMIDH. The complementary output nodes OUTN3 and OUT3 of the circuit 80 change their state either from VMIDL to VMIDH level or reciprocally depending upon the logic state of the received input signal IN.

The drive transistor M8 is a p-channel MOSFET device having a source terminal coupled to third output node OUTN3 and a drain terminal coupled to the gate of transistor M6. The gate of transistor M8 is coupled to the second output node OUTN2. The drive transistor M9 is a p-channel MOSFET device having a source terminal coupled to third output node OUT3 and a drain terminal coupled to the gate of transistor M7. The gate of transistor M9 is coupled to the second output node OUT2.

The pair of transistors M10 and M11 are coupled, respectively, in series with transistors M6 and M7 at the complementary output nodes OUTN3 and OUT3 with the source terminals of transistors M10 and M11 coupled, respectively, to the source terminals of transistors M6 and M7. The gate terminals of cascode transistors M10 and M11 are coupled to receive the high cascode supply voltage VMIDH. Drain terminals of the transistors M10 and M11 are coupled, respectively, to a fourth pair of complementary output nodes OUTN4 and OUT4. The transistors M10 and M11 are n-channel MOSFET devices. The complementary output nodes OUTN4 and OUT4 of the circuit 80 change their state either from VMIDL to VHIGH or reciprocally depending upon the logic state of the received input signal IN.

The pair of transistors M14 and M15 are coupled, respectively, in series with transistors M10 and M11 at the complementary output nodes OUTN4 and OUT4 with the drain terminals of transistors M14 and M15 coupled, respectively, to the drain terminals of transistors M10 and M11. The gate terminals of cascode transistors M14 and M15 are coupled to receive the high cascode supply voltage VMIDH. Source terminals of the transistors M14 and M15 are coupled, respectively, to a fifth pair of complementary output nodes OUTN5 and OUT5. The transistors M14 and M15 are p-channel MOSFET devices. The transistors M18 and M19 are p-channel MOSFET devices having gate terminals cross-coupled in a latching circuit to the complementary output nodes OUTN5 and OUT5. Drain terminals of the transistors M18 and M19 are coupled, respectively, to the complementary output nodes OUTN5 and OUT5. Source terminals of the transistors M18 and M19 are coupled to the high supply voltage VHIGH. The complementary output nodes OUTN5 and OUT5 of the circuit 80 change their state either from VMIDH to VHIGH level or reciprocally depending upon the logic state of the received input signal IN.

The drive transistor M16 is a p-channel MOSFET device having a source terminal coupled to fifth output node OUTN5 and a drain terminal coupled to the gate of transistor M14. The gate of transistor M16 is coupled to the fourth output node OUTN4. The drive transistor M17 is a p-channel MOSFET device having a source terminal coupled to fifth output node OUT5 and a drain terminal coupled to the gate of transistor M15. The gate of transistor M17 is coupled to the fourth output node OUT4.

The VMIDH and VMIDL voltages are used for cascoding to prevent the transistor devices from stress and to help to isolate the transistors working at higher voltage domain with those working at lower voltage domain. The transistors M2, M3, M6, M7, M10, M11, M14 and M15 are used as cascoded stages. The gates of transistors M2, M3, M6 and M7 are driven by VMIDL supply and the gates of transistors M10, M11, M14 and M15 are driven by VMIDH supply.

The transistors M8 and M9 are used to drive the minimum voltage of the complementary output nodes OUT3 and OUTN3 node to the VMIDL supply voltage. Similarly, the transistors M16 and M17 are used to drive the minimum voltage of the complementary output nodes OUT5 and OUTN5 to the VMIDH level. The PMOS transistors M4, M5, M12, M13, M18 and M19 are used in cross coupled fashion to compare and latch the respective outputs when the input is idle and have better noise margins.

The following Tables summarize operation of the circuit 80:

TABLE 8

| Input | | Output | | | | |
|---|---|---|---|---|---|---|
| IN | INN | OUT1 | OUT2 | OUT3 | OUT4 | OUT5 |
| VLOW | 0v | VMIDL | VMIDH | VMIDH | VHIGH | VHIGH |
| 0v | VLOW | 0v | 0v | VMIDL | VMIDL | VMIDH |

TABLE 9

| Input | | Output | | | | |
|---|---|---|---|---|---|---|
| IN | INN | OUTN1 | OUTN2 | OUTN3 | OUTN4 | OUTN5 |
| VLOW | 0v | 0v | 0v | VMIDL | VMIDL | VMIDH |
| 0v | VLOW | VMIDL | VMIDH | VMIDH | VHIGH | VHIGH |

Operation of the circuit 80 may be better understood by reference to the following:

In an example, the maximum operating voltage of all transistor devices in circuit 80 is 4.5V. The input logic signal IN varies between VLOW (1.8V) to 0V. The low cascode voltage VMIDL=4.5V, the high cascode voltage VMIDH=9V and the high supply voltage VHIGH=13.5V.

When input signal IN is at 0V level (i.e., logic "0"), the first output node OUT1 and the second output node OUT2 are discharged to 0V. The third output node OUT3 and the fourth output node OUT4 are charged to the VMIDL voltage level. The fifth output node OUT5 is at the VMIDH voltage level. Simultaneously, the fourth output node OUTN4 and the fifth output node OUTN5 are charged to the VHIGH level. The second output node OUTN2 and the third output node OUTN3 settle to the VMIDH level and the first output node OUTN1 is at the VMIDL voltage level.

When the input signal "IN" switches from 0V to VLOW=1.8V level (i.e, switch from logic "0" to logic "1"), the first output node OUTN1 starts to discharge from the VMIDL voltage level to 0V. The second output node OUTN2 and the third output node OUTN3 start to discharge from the VMIDH level through transistors M2 and M6, respectively. Similarly, the fourth output node OUTN4 and the fifth output node OUTN5 start discharging their node voltages from VHIGH level through transistors M10 and M14, respectively. So, for a short period of discharge time the fifth output node OUTN5 follows the fourth output node OUTN4 and the third output node OUTN3 follows the second output node OUTN2.

Now, as the third output node OUTN3 discharges to VMIDL+|Vtp|, the transistor M6 moves into cutoff region and is switched off. The second output node OUTN2 continues to discharge from VMIDL+|Vtp| to 0V. As soon as transistor M8 sees a certain |Vgs| (Gate to Source voltage), it will drive the third output node OUTN3 to the VMIDL level. Similarly, with respect to the fifth output node OUTN5, transistor M14 goes to cutoff when the fifth output node OUTN5 is at VMIDH+|Vtp|. The fourth output node OUTN4 continues to discharge to the VMIDL voltage, and the transistor M16 then drives the fifth output node OUTN5 to the VMIDH level.

Simultaneously, since the first output node OUTN1 is discharged to 0V, the gate of transistor M5 is also at 0V and transistor M5 then charges the first output node OUT1 to the VMIDL voltage level (this node initially being floating since the input INN is at 0V and the transistor M1 is switched off). The second output node OUT2 is also a floating node and there is no current path from this node to GND while following the first output node OUT1 until the node charges up to VMIDL−|Vtn| and transistor M3 is cut off. The third output node OUT3 charges up to the VMIDH voltage through transistor M13 whose gate is at the VMIDL level. The second output node OUT2 is also a floating node and will follow the third output node OUT3 in charging to the VMIDH voltage level. During this time, the transistor M9 will try to sink some current from the VMIDH supply to the VMIDL supply since its gate is initially at VMIDL−|Vtn|. Transistor M9 is soon switched off, however, when its gate is charged to the VMIDH level. The speed with which the gate of transistor M9 charges to the VMIDH voltage depends on the current driving strength of transistor M7 and the size (W/L ratio) of transistors M7 and M9.

The same phenomenon occurs with respect to the fourth output node OUT4 and the fifth output node OUT5 node where the respective nodes are charged up to VHIGH voltage level through transistors M15 and M19.

FIGS. 5A-5C and 6A-6B show simulation results for the circuit 80. The circuit 80 was simulated in 130 nm HCMOS9A technology with capacitive loads coupled to the output nodes. The high supply voltage VHIGH=13.5 v and the intermediate cascode voltages are VMIDH=9V and VMIDL=4.5V.

Figure 5A:
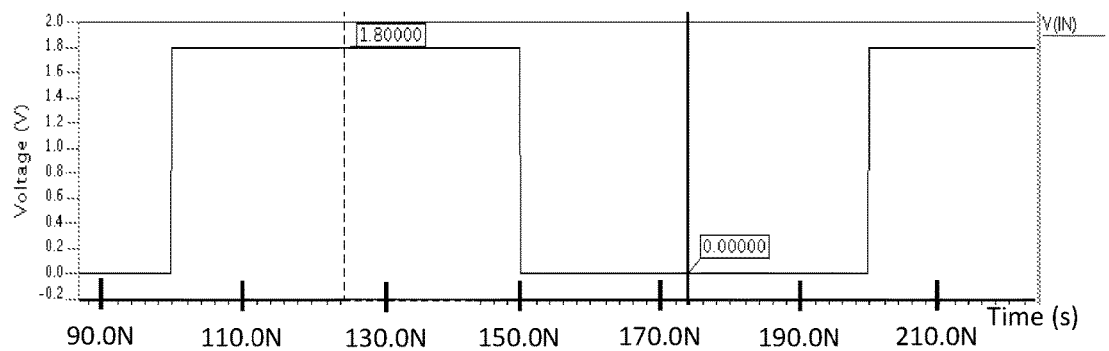
FIGS. 5A-5C and 6A-6B illustration simulation operation of the circuit of FIG. 4.
Figure 5B:
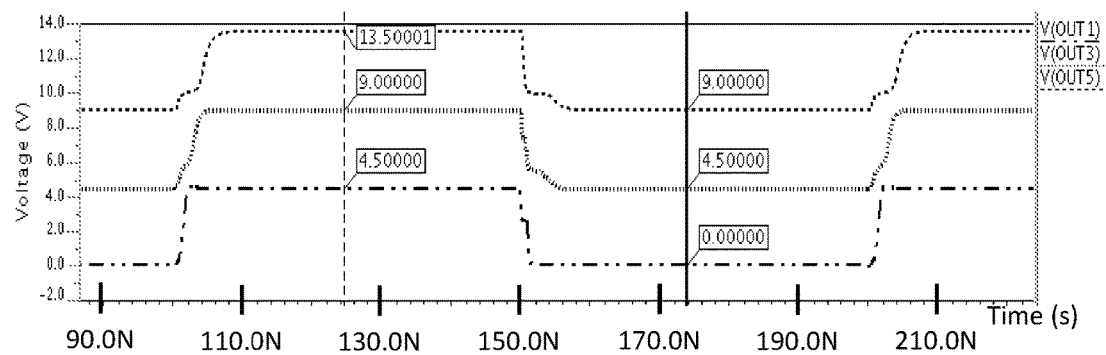
Figure 5C:
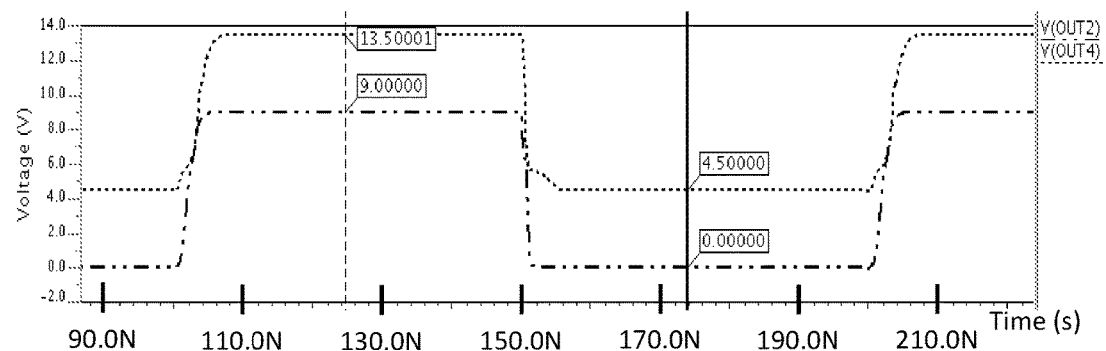
Figure 6A:
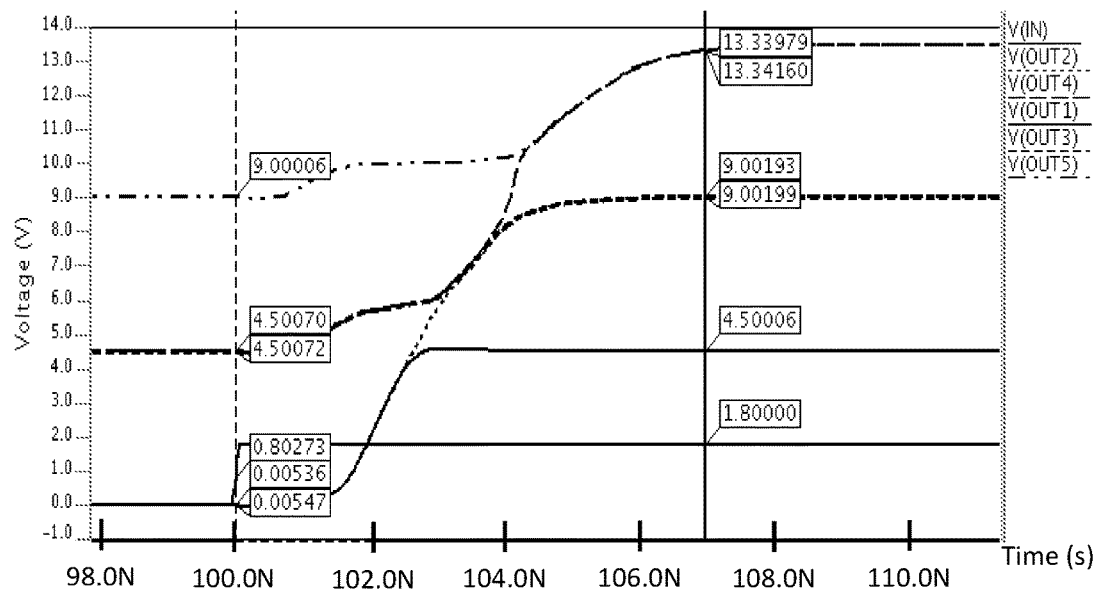
Figure 6B:
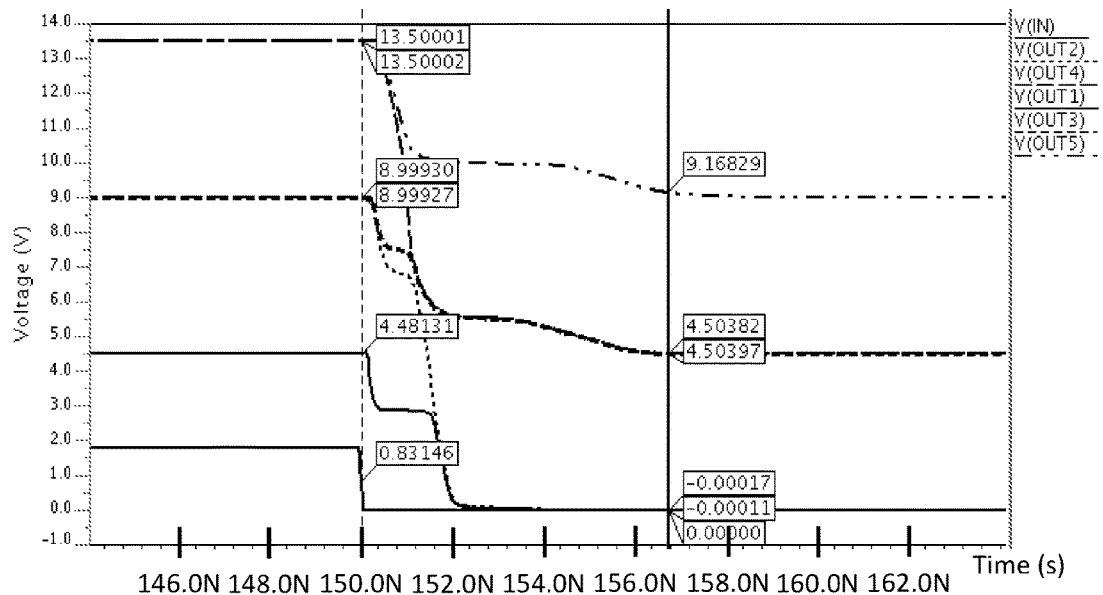

FIG. 5A shows the input signal IN waveform. FIG. 5B shows the output signal waveforms for the first, third and fifth output nodes OUT1, OUT3 and OUT5, respectively. FIG. 5C shows the output signal waveforms for the second and fourth output nodes OUT2 and OUT4, respectively. FIGS. 6A and 6B show details at the logic transitions. FIG. 6A shows the simulation result when the input is changing from 0V to 1.8V and FIG. 6B shows the simulation result when the input is changing from 1.8V to 0V.

The simulation results indicate that the circuit 80 operates with a rise time of 6.95 ns and a fall time of 6.73 ns and possesses a symmetric duty cycle.

To summarize, the advantages of the circuit 80 in comparison to the prior art circuits discussed herein include: fewer number of supply voltages; no voltage stress across any transistor; multiple output voltage levels; proper driving of all output nodes to support more load capacitance; wide supply voltage range; and high speed operation.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A level shifting circuit, comprising:
   a pair of input transistors of a first type coupled respectively between a first pair of complementary output nodes and a reference supply node;

a first pair of cascode transistors of the first type coupled between a second pair of complementary output nodes and the first pair of complementary output nodes, respectively, wherein control terminals of the first pair of cascode transistors are coupled to receive a first cascode supply voltage;

a second pair of cascode transistors of a second type coupled between a third pair of complementary output nodes and the second pair of complementary output nodes, respectively, wherein control terminals of the second pair of cascode transistors are coupled to receive the first cascode supply voltage;

a first drive transistor having a source-drain path coupled between one output node of the third pair of complementary output nodes and the control terminal of one transistor of the second pair of cascode transistors, a control terminal of the first drive transistor directly connected to one output node of the second pair of complementary output nodes; and a second drive transistor having a source-drain path coupled between another output node of the third pair of complementary output nodes and the control terminal of another transistor of the second pair of cascode transistors, a control terminal of the second drive transistor directly connected to another output node of the second pair of complementary output nodes.

2. The circuit of claim 1, further comprising:

a third pair of cascode transistors of the first type coupled between a fourth pair of complementary output nodes and the third pair of complementary output nodes, respectively, wherein control terminals of the third pair of cascode transistors are coupled to receive a second cascode supply voltage; and wherein the supply voltage is the second cascode supply voltage.

3. The circuit of claim 2, further comprising:

a fourth pair of cascode transistors of the second type coupled between a fifth pair of complementary output nodes and the fourth pair of complementary output nodes, respectively, wherein control terminals of the fourth pair of cascode transistors are coupled to receive the second cascode supply voltage;

a third drive transistor having a source-drain path coupled between one output node of the fifth pair of complementary output nodes and the control terminal of one transistor of the fourth pair of cascode transistors, a control terminal of the third drive transistor directly connected to one output node of the fourth pair of complementary output nodes; and a fourth drive transistor having a source-drain path coupled between another output node of the fifth pair of complementary output nodes and the control terminal of another transistor of the fourth pair of cascode transistors, a control terminal of the fourth drive transistor directly connected to another output node of the fourth pair of complementary output nodes.

4. The circuit of claim 3, further comprising a pair of cross-coupled transistors coupled between an output supply voltage and the fifth pair of complementary output nodes.

5. A circuit, comprising:

a pair of input transistors of a first type coupled respectively between a first pair of complementary output nodes and a reference supply node;

a first pair of cascode transistors of the first type coupled between a second pair of complementary output nodes and the first pair of complementary output nodes, respectively, wherein control terminals of the first pair of cascode transistors are coupled to receive a first cascode supply voltage;

a second pair of cascode transistors of a second type coupled between a third pair of complementary output nodes and the second pair of complementary output nodes, respectively, wherein control terminals of the second pair of cascode transistors are coupled to receive the first cascode supply voltage;

a first drive transistor having a source-drain path coupled between one output node of the third pair of complementary output nodes and the control terminal of one transistor of the second pair of cascode transistors, a control terminal of the first drive transistor coupled to one output node of the second pair of complementary output nodes;

a second drive transistor having a source-drain path coupled between another output node of the third pair of complementary output nodes and the control terminal of another transistor of the second pair of cascode transistors, a control terminal of the second drive transistor coupled to another output node of the second pair of complementary output nodes;

a first pair of cross-coupled transistors coupled between the first cascode supply voltage and the first pair of complementary output nodes, respectively; and a second pair of cross-coupled transistors coupled between a supply voltage and the second pair of complementary output nodes.

6. The circuit of claim 5, further comprising:

a third pair of cascode transistors of the first type coupled between a fourth pair of complementary output nodes and the third pair of complementary output nodes, respectively, wherein control terminals of the third pair of cascode transistors are coupled to receive a second cascode supply voltage; and wherein the supply voltage is the second cascode supply voltage.

7. The circuit of claim 6, further comprising:

a fourth pair of cascode transistors of the second type coupled between a fifth pair of complementary output nodes and the fourth pair of complementary output nodes, respectively, wherein control terminals of the fourth pair of cascode transistors are coupled to receive the second cascode supply voltage;

a third drive transistor having a source-drain path coupled between one output node of the fifth pair of complementary output nodes and the control terminal of one transistor of the fourth pair of cascode transistors, a control terminal of the third drive transistor coupled to one output node of the fourth pair of complementary output nodes; and a fourth drive transistor having a source-drain path coupled between another output node of the fifth pair of complementary output nodes and the control terminal of another transistor of the fourth pair of cascode transistors, a control terminal of the fourth drive transistor coupled to another output node of the fourth pair of complementary output nodes.

8. The circuit of claim 7, further comprising a third pair of cross-coupled transistors coupled between an output supply voltage and the fifth pair of complementary output nodes.

9. A level shifting circuit, comprising:

an input transistor of a first type having a first conduction terminal coupled to a first output node, a second conduction terminal coupled to a reference supply node and a control terminal coupled to receive an input signal;
a first cascode transistor of the first type having a first conduction terminal coupled to a second output node, a second conduction terminal coupled to the first output node and a control terminal coupled to receive a first cascode supply voltage;
a second cascode transistor of a second type having a first conduction terminal coupled to a third output node, a second conduction terminal coupled to the second output node and a control terminal coupled to receive the first cascode supply voltage; and
a first drive transistor of the second type having a first conduction terminal coupled to the third output node, a second conduction terminal coupled to the control terminal of the second cascode transistor and a control terminal directly connected to the second output node.

10. The circuit of claim 9, further comprising a third cascode transistor of the first type having a first conduction terminal coupled to a fourth output node, a second conduction terminal coupled to the third output node and a control terminal coupled to receive a second cascode supply voltage.

11. The circuit of claim 10, further comprising:
a fourth cascode transistor of the second type having a first conduction terminal coupled to a fifth output node, a second conduction terminal coupled to the fourth output node and a control terminal coupled to receive the second cascode supply voltage; and
a second drive transistor of the second type having a first conduction terminal coupled to the fifth output node, a second conduction terminal coupled to the control terminal of the fourth cascode transistor and a control terminal directly connected to the fourth output node.

12. The circuit of claim 11, further comprising a cross coupled latching circuit coupled between an output supply voltage and the fifth output node.

13. The circuit of claim 9, further comprising a cross coupled latching circuit coupled between a supply voltage and the third output node.

14. A circuit, comprising:
an input transistor of a first type having a first conduction terminal coupled to a first output node, a second conduction terminal coupled to a reference supply node and a control terminal coupled to receive an input signal;
a first cascode transistor of the first type having a first conduction terminal coupled to a second output node, a second conduction terminal coupled to the first output node and a control terminal coupled to receive a first cascode supply voltage;
a second cascode transistor of a second type having a first conduction terminal coupled to a third output node, a second conduction terminal coupled to the second output node and a control terminal coupled to receive the first cascode supply voltage;
a first drive transistor of the second type having a first conduction terminal coupled to the third output node, a second conduction terminal coupled to the control terminal of the second cascode transistor and a control terminal coupled to the second output node; and
a first cross coupled latching circuit coupled between the first cascode supply voltage and the first output node.

15. The circuit of claim 14, further comprising a second cross coupled latching circuit coupled between a supply voltage and the third output node.

16. The circuit of claim 15, further comprising a third cascode transistor of the first type having a first conduction terminal coupled to a fourth output node, a second conduction terminal coupled to the third output node and a control terminal coupled to receive a second cascode supply voltage, wherein said supply voltage is the second cascode supply voltage.

17. The circuit of claim 16, further comprising:
a fourth cascode transistor of the second type having a first conduction terminal coupled to a fifth output node, a second conduction terminal coupled to the fourth output node and a control terminal coupled to receive the second cascode supply voltage; and
a second drive transistor of the second type having a first conduction terminal coupled to the fifth output node, a second conduction terminal coupled to the control terminal of the fourth cascode transistor and a control terminal coupled to the fourth output node.

18. The circuit of claim 17, further comprising a third cross coupled latching circuit coupled between an output supply voltage and the fifth output node.

19. A level shifting circuit, comprising:
an input transistor of a first type having a first conduction terminal directly connected to a first node, a second conduction terminal coupled to a reference supply node and a control terminal coupled to receive an input signal;
a first cascode transistor of the first type having a first conduction terminal directly connected to a second node, a second conduction terminal directly connected to the first node and a control terminal coupled to receive a first cascode supply voltage;
a second cascode transistor of a second type having a first conduction terminal directly connected to a first output node, a second conduction terminal directly connected to the second node and a control terminal coupled to receive the first cascode supply voltage;
a first drive transistor of the second type having a first conduction terminal coupled to the first output node, a second conduction terminal coupled to the control terminal of the second cascode transistor and a control terminal directly connected to the second node; and
a first cross coupled latching circuit powered from a supply voltage other than a voltage at the reference supply node and directly connected to the first output node.

20. A circuit, comprising:
an input transistor of a first type having a first conduction terminal coupled to a first node, a second conduction terminal coupled to a reference supply node and a control terminal coupled to receive an input signal;
a first cascode transistor of the first type having a first conduction terminal coupled to a second node, a second conduction terminal coupled to the first node and a control terminal coupled to receive a first cascode supply voltage;
a second cascode transistor of a second type having a first conduction terminal coupled to a first output node, a second conduction terminal coupled to the second node and a control terminal coupled to receive the first cascode supply voltage;
a first drive transistor of the second type having a first conduction terminal coupled to the first output node, a second conduction terminal coupled to the control terminal of the second cascode transistor and a control terminal coupled to the second node;

a first cross coupled latching circuit coupled between a supply voltage and the first output node; and a third cascode transistor of the first type having a first conduction terminal coupled to a third node, a second conduction terminal coupled to the first output node and a control terminal coupled to receive a second cascode supply voltage, wherein said supply voltage is the second cascode supply voltage.

21. The circuit of claim 20, further comprising:

a fourth cascode transistor of the second type having a first conduction terminal coupled to a second output node, a second conduction terminal coupled to the third node and a control terminal coupled to receive the second cascode supply voltage; and a second drive transistor of the second type having a first conduction terminal coupled to the second output node, a second conduction terminal coupled to the control terminal of the fourth cascode transistor and a control terminal coupled to the third node.

22. The circuit of claim 21, further comprising a second cross coupled latching circuit coupled between an output supply voltage and the second output node.

\* \* \* \* \*